United States Patent
AuBuchon et al.

(10) Patent No.: US 12,060,638 B2
(45) Date of Patent: Aug. 13, 2024

(54) DEPOSITION APPARATUS AND METHODS USING STAGGERED PUMPING LOCATIONS

(71) Applicant: Applied Materials, Inc., Santa Clara, CA (US)

(72) Inventors: Joseph AuBuchon, San Jose, CA (US); Sanjeev Baluja, Campbell, CA (US); Ashutosh Agarwal, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/120,186

(22) Filed: Dec. 13, 2020

(65) Prior Publication Data
US 2022/0186367 A1   Jun. 16, 2022

(51) Int. Cl.
| C23C 16/44 | (2006.01) |
| C23C 16/455 | (2006.01) |
| C23C 16/458 | (2006.01) |
| H01L 21/687 | (2006.01) |

(52) U.S. Cl.
CPC .... *C23C 16/4412* (2013.01); *C23C 16/45551* (2013.01); *C23C 16/4584* (2013.01); *H01L 21/68764* (2013.01)

(58) Field of Classification Search
CPC ..... C23C 16/54; C23C 16/545; C23C 14/568; C23C 16/45551; C23C 16/4412; C23C 16/4401; H01L 21/6719; H01L 21/67196; H01L 21/67201; H01L 21/67173; H01L 21/67184; H01L 21/6776; H01L 21/67161; H01L 21/67155; H01L 21/67017; H01L 21/67069; H01L 21/67748; H01L 21/67751; H01L 21/67745

USPC .......... 118/719; 156/345.22, 345.2
See application file for complete search history.

(56) References Cited

U.S. PATENT DOCUMENTS

| 7,153,542 B2* | 12/2006 | Nguyen | H01L 21/6719 204/192.12 |
| 8,617,347 B2* | 12/2013 | Kim | H01J 37/3244 156/345.31 |
| 2008/0026162 A1* | 1/2008 | Dickey | C23C 16/45551 427/595 |
| 2012/0132618 A1* | 5/2012 | Baluja | H01L 21/67115 118/723 R |
| 2012/0145078 A1* | 6/2012 | Huang | C23C 16/4412 239/548 |
| 2014/0261176 A1 | 9/2014 | Liu et al. | |

(Continued)

FOREIGN PATENT DOCUMENTS

| CN | 110942982 A | 3/2020 |
| KR | 20050080433 A | 8/2005 |
| KR | 20080025509 A | 3/2008 |

OTHER PUBLICATIONS

Machine translation of KR20050080433 (A).
PCT International Search Report and Written Opinion in PCT/US2021/063015 dated Apr. 11, 2022, 11 pages.

*Primary Examiner* — Rudy Zervigon
(74) *Attorney, Agent, or Firm* — Servilla Whitney LLC (57) ABSTRACT

Processing chambers and methods of use comprising a plurality of processing regions bounded around an outer peripheral edge by one or more vacuum channel. A first processing region has a first vacuum channel with a first outer diameter and a second processing region has a second vacuum channel with a second outer diameter, the first outer diameter being less than the second outer diameter.

14 Claims, 8 Drawing Sheets

(56) References Cited

U.S. PATENT DOCUMENTS

| | | |
|---|---|---|
| 2015/0275364 A1 | 10/2015 | Thompson et al. |
| 2015/0361553 A1* | 12/2015 | Murakawa ........ C23C 16/45561 |
| | | 156/345.55 |
| 2019/0131167 A1* | 5/2019 | Rice .................... C23C 16/4586 |
| 2019/0139745 A1 | 5/2019 | Gong et al. |
| 2019/0316255 A1* | 10/2019 | Shugrue ............ C23C 16/45565 |
| 2020/0032396 A1 | 1/2020 | Polyak et al. |
| 2020/0066572 A1* | 2/2020 | AuBuchon ........ H01L 21/68771 |
| 2020/0090978 A1* | 3/2020 | AuBuchon ........ H01L 21/67017 |
| 2022/0018024 A1* | 1/2022 | Tong ................ H01J 37/32449 |

* cited by examiner

DEPOSITION APPARATUS AND METHODS USING STAGGERED PUMPING LOCATIONS

TECHNICAL FIELD

Embodiments of the disclosure generally relate to apparatus and methods decreasing the transition deposition zone. In particular, some embodiments of the disclosure relate to a batch processing chamber with staggered pumping channels.

BACKGROUND

In Atomic Layer Deposition (ALD) chambers, deposition may occur on portions of the chamber other than the processed wafers. In this case, chambers are usually constructed such that the parts on which deposition occurs can be cleaned in-situ or removed for ex-situ cleaning. The set of parts that gets swapped out periodically may be referred to as the process kit.

In some cases, deposition on the process kit can build up to the point that it flakes off and causes defect problems on the processed wafers. The unwanted deposition can also lead to process drifts such as variations in film thickness, film uniformity, or film properties. Some deposited films do not have good options for in-situ cleaning, so the process kits accumulate deposition until they need to be removed and potentially replaced. This can lead to machine downtime and increased operating costs.

In some batch processing chambers, where substrates are moved between different processing stations (also referred to as processing regions) on the same electrostatic chuck, it is possible to prevent deposition on most of the chamber parts due to the separation of reactants between different processing stations. However, the electrostatic chuck which supports the wafer moves among different stations along with the wafer. Portions of the electrostatic chuck are exposed to the process conditions in the processing stations and will also accumulate unwanted film deposition.

In these cases, deposition at the edge of electrostatic chucks can be limited to not extend beyond the pumping channels due to a backside purge flow in the chamber. At the edge of the wafer/electrostatic chuck is a transition region where deposition decreases from being comparable to the deposition on the wafer down to no deposition.

Accordingly, there is a need for apparatus and methods which provide decreased deposition on process chamber surfaces.

SUMMARY

One or more embodiments of the disclosure are directed to processing chambers comprising a plurality of processing regions. Each of the processing regions independently has a height defined by a front face of a gas distribution plate and a top surface of a substrate support. Each of the processing regions is bounded around an outer peripheral edge by one or more vacuum channel. A first processing region has a first vacuum channel with a first outer diameter and a second processing region has a second vacuum channel with a second outer diameter. The first outer diameter is less than the second outer diameter.

Additional embodiments of the disclosure are directed to methods of processing a substrate. A substrate is exposed to a first reactant within a first processing region and a second reactant within a second processing region of a processing chamber. The first processing region has a first height defined by a front face of a first gas distribution plate and a top surface of a substrate support. The first processing region has a first vacuum channel with a first outer diameter. The second processing region has a second height defined by a front face of a second gas distribution plate and the top surface of the substrate support. The second processing region has a second vacuum channel with a second outer diameter. One of the first outer diameter of the first vacuum channel or second outer diameter of the second vacuum channel is greater than the other of the first vacuum channel or second vacuum channel.

Further embodiments of the disclosure are directed to processing chambers comprising a substrate support, a first processing region and a second processing region. The substrate support has a top surface configured to support a wafer during processing and move the wafer between a plurality of processing regions. The first processing region comprises a first gas distribution plate having a first front face opposite the top surface of the substrate support. The first gas distribution plate is bounded by a first vacuum channel on the first front face having a first outer diameter. The second processing region comprises a second gas distribution plate having a second front face opposite the top surface of the substrate support. The second gas distribution plate is bounded by a second vacuum channel on the second front face. The second vacuum channel has a second outer diameter which is greater than the first outer diameter.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

Most deposition chambers do not have separated chemistries and pump the various chemistries through the same pump port locations. In some recent batch processing chambers, precursors are separated between different processing stations. Pumping hardware can be used to pump gases through the same location relative to the wafers. The issue of deposition build-up remains in this arrangement. Accordingly, one or more embodiment of the disclosure staggers the pumping locations between the spatially separated processing stations. Some embodiments use different sensitivities to each of the reactive gases to minimize support surface deposition.

One or more embodiments of the disclosure are directed to methods and apparatus for decreasing the width of the transition region between uniform deposition on a wafer and no deposition on a neighboring support surface. Some embodiments advantageously provide apparatus and methods to minimize or eliminate off-wafer deposition by staggering the pumping locations relative to the wafer.

Figure 1:
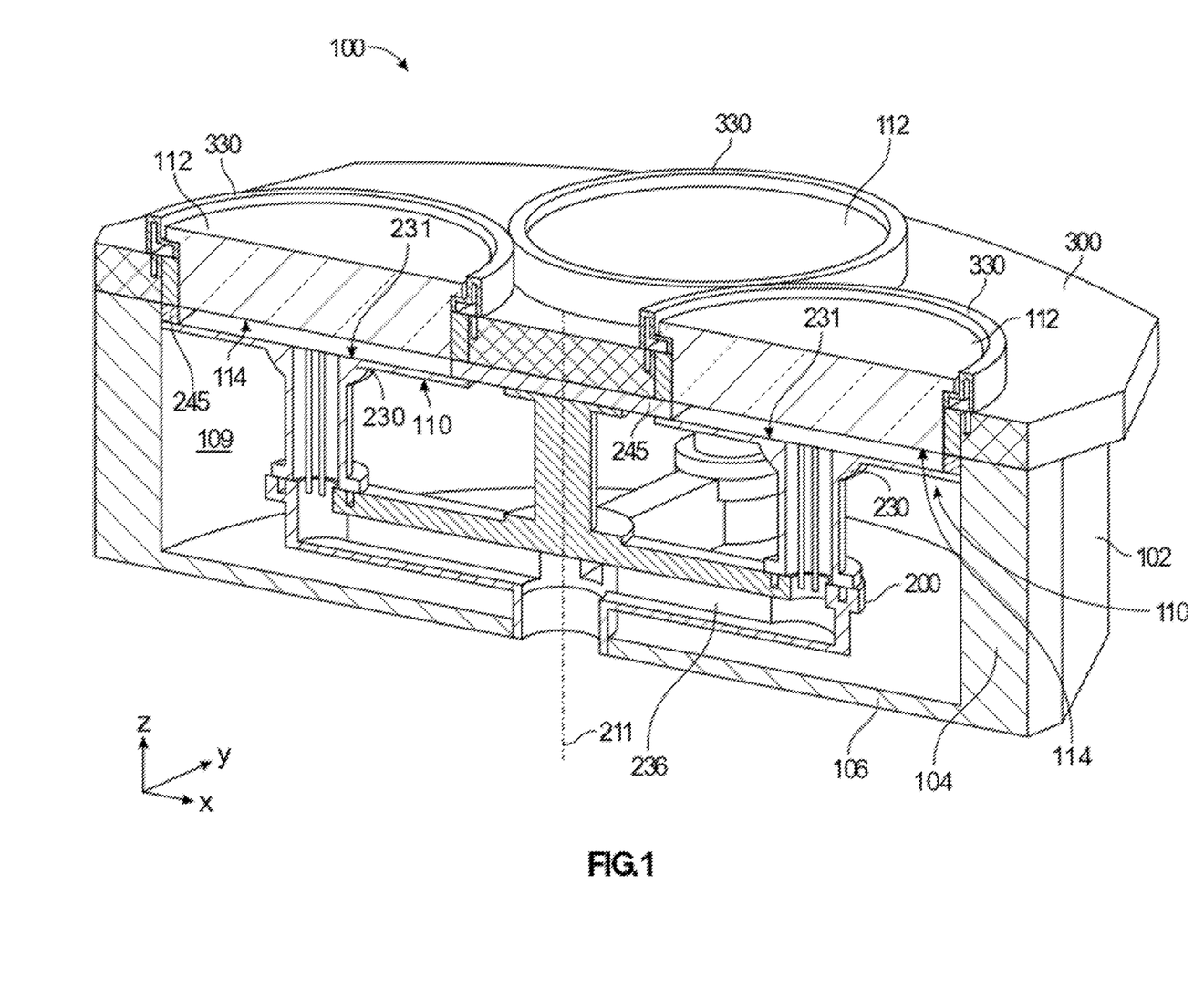
FIG. 1 shows a cross-sectional isometric view of a processing chamber in accordance with one or more embodiments of the disclosure.

While the following description is primarily presented with respect to a batch processing chamber like that shown in FIG. 1, the skilled artisan will recognize that that scope of the disclosure is not limited to batch chambers. In some embodiments, a gas distribution plate and/or pumping components are configured to provide staggered pumping for different locations relative to the wafer.

Figure 2:
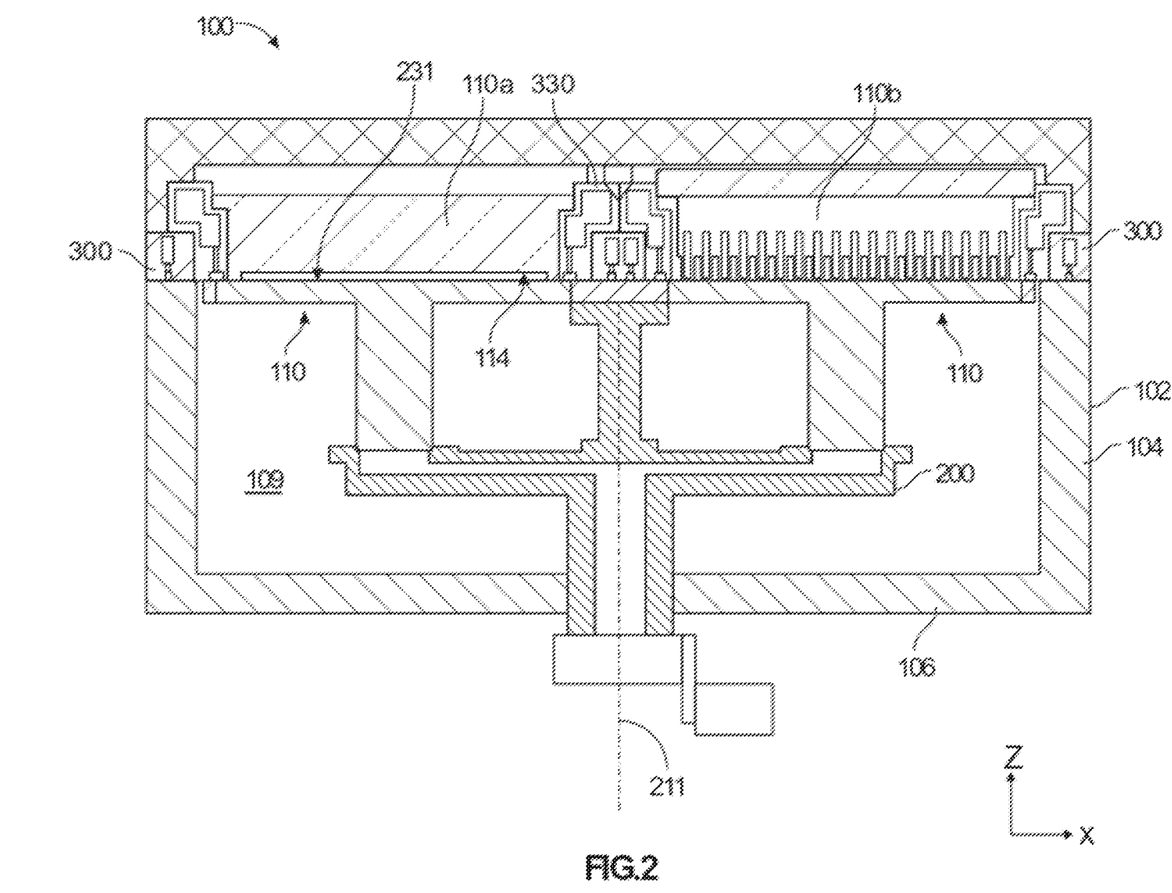
FIG. 2 shows a cross-sectional view of a processing chamber in accordance with one or more embodiments of the disclosure.

FIGS. 1 and 2 illustrate a batch processing chamber 100 in accordance with one or more embodiment of the disclosure. FIG. 1 shows the processing chamber 100 illustrated as a cross-sectional isometric view in accordance with one or more embodiment of the disclosure. FIG. 2 shows a processing chamber 100 in cross-section according to one or more embodiment of the disclosure. Accordingly, some embodiments of the disclosure are directed to processing chambers 100 that incorporate a substrate support 200 and top plate 300.

The processing chamber 100 has a housing 102 with walls 104 and a bottom 106. The housing 102 along with the top plate 300 define an interior volume 109, also referred to as a processing volume.

The processing station 110 illustrated comprises three main components: the top plate 300 (also called a lid), a pump/purge insert 330 and a gas distribution plate 112. The processing chamber 100 further includes a plurality of processing stations 110. The processing stations 110 are located in the interior volume 109 of the housing 102 and are positioned in a circular arrangement around the rotational axis 211 of the substrate support 200. Each processing station 110 comprises a gas distribution plate 112 (also referred to as a gas injector) having a front surface 114. In some embodiments, the front surfaces 114 of each of the gas distribution plates 112 are substantially coplanar. The processing stations 110 are defined as a region in which processing can occur. For example, in some embodiments, a processing station 110 is defined as a region bounded by the support surface 231 of the substrate support 200, as described below, and the front surface 114 of the gas distribution plate 112. In the illustrated embodiment, heaters 230 act as the substrate support surfaces and form part of the substrate support 200. Each of the heaters 230 comprising the support surface 231 and a bottom surface 232 defining a thickness of the heaters 230. In some embodiments, the support surface 231 further includes provisions for at least three lift pins extending through the support surface 231. A support plate 245 is around the heaters 230 in the illustrated embodiment. The support plate 245 is connected to the substrate support 200 and has a plurality of openings which the heaters 230 extend through. In some embodiments, the support plate 245 provides a flow path for a backside purge gas.

The processing stations 110 can be configured to perform any suitable process and provide any suitable process conditions. The type of gas distribution plate 112 used depends on, for example, the type of process being performed and the type of showerhead or gas injector. For example, a processing station 110 configured to operate as an atomic layer deposition apparatus may have a showerhead or vortex type gas injector. Whereas, a processing station 110 configured to operate as a plasma station may have one or more electrode and/or grounded plate configuration to generate a plasma while allowing a plasma gas to flow toward the wafer. The embodiment illustrated in FIG. 2 has a different type of processing station 110 on the left side (processing station 110a) of the drawing than on the right side (processing station 110b) of the drawing. Suitable processing stations 110 include, but are not limited to, thermal processing stations, microwave plasma, three-electrode CCP, ICP, parallel plate CCP, UV exposure, laser processing, pumping chambers, annealing stations and metrology stations. While the embodiment illustrated in FIGS. 1 and 2 show a four-fold symmetric arrangement of processing stations, the scope of the disclosure is not limited to four station processing chambers.

In some embodiments, the rate of deposition thickness decrease in this transition region depends on the deposition chemistries used and the sensitivity of the deposition process to concentrations of the precursors. In some embodiments, narrower transition regions allow for uniform deposition on a larger area of the processed wafer, while decreasing deposition on surfaces other than the wafer.

Figure 3:
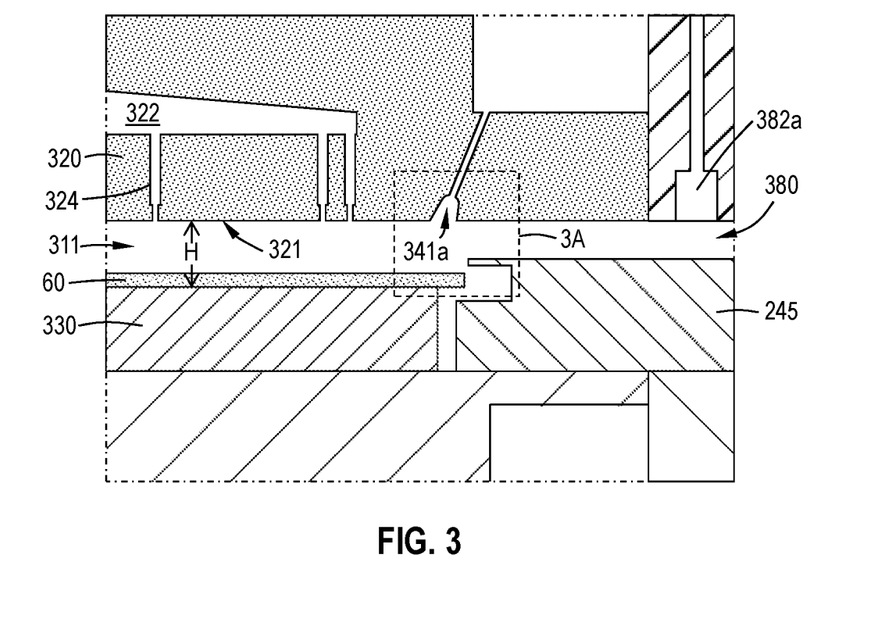
FIG. 3 shows a partial cross-sectional schematic view of a process region in accordance with one or more embodiment of the disclosure.
Figure 3A:
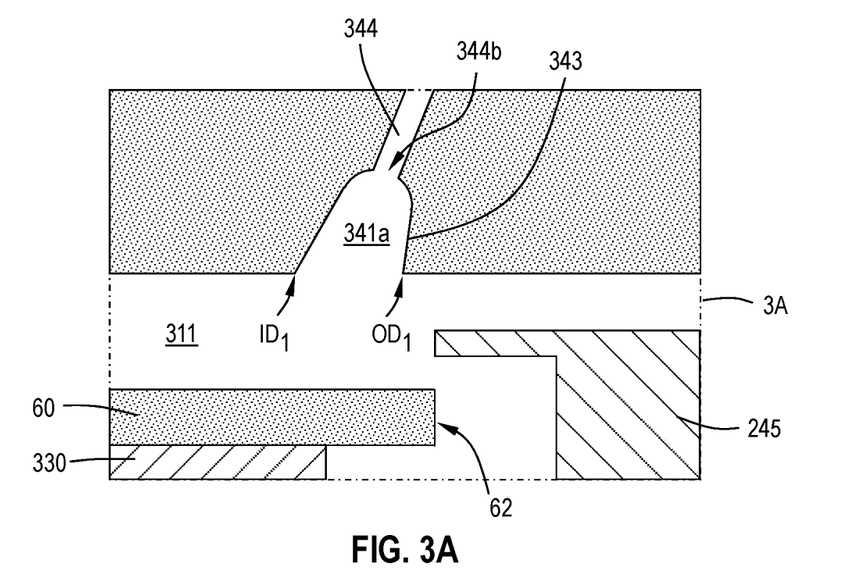
FIG. 3A shows an expanded view of region 3A of FIG. 3.
Figure 3B:
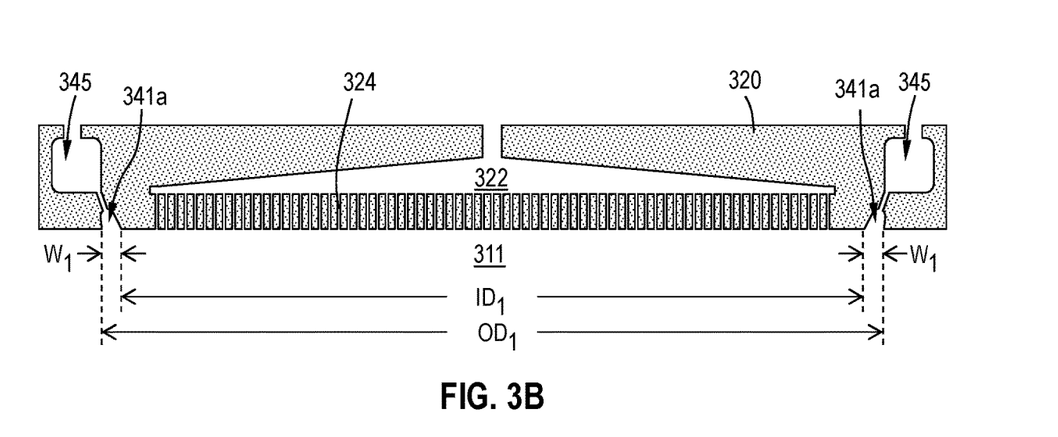
FIG. 3B shows a cross-sectional schematic view of a gas distribution plate in accordance with one or more embodiment of the disclosure.
Figure 4:
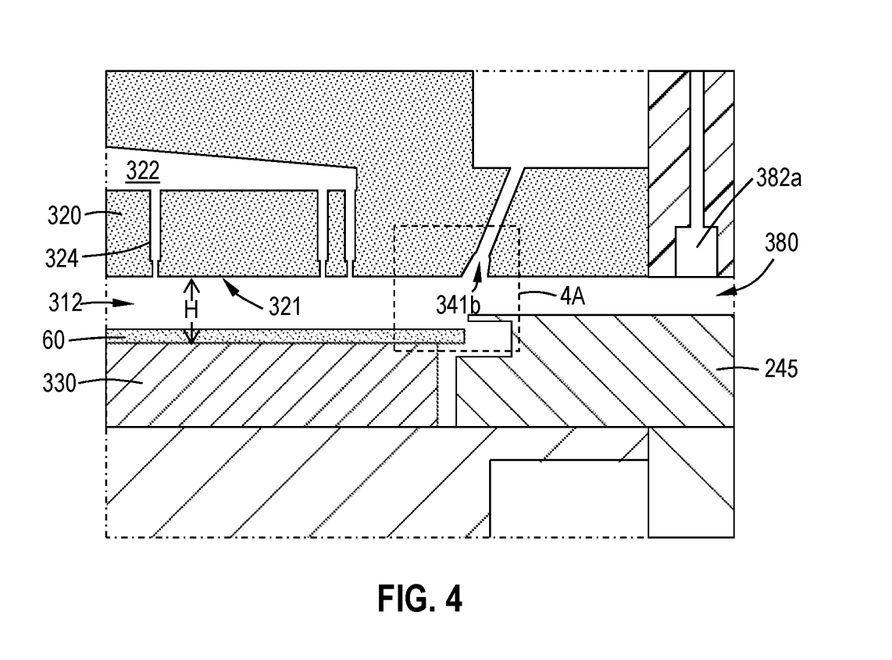
FIG. 4 shows a partial cross-sectional schematic view of a process region in accordance with one or more embodiment of the disclosure.
Figure 4A:
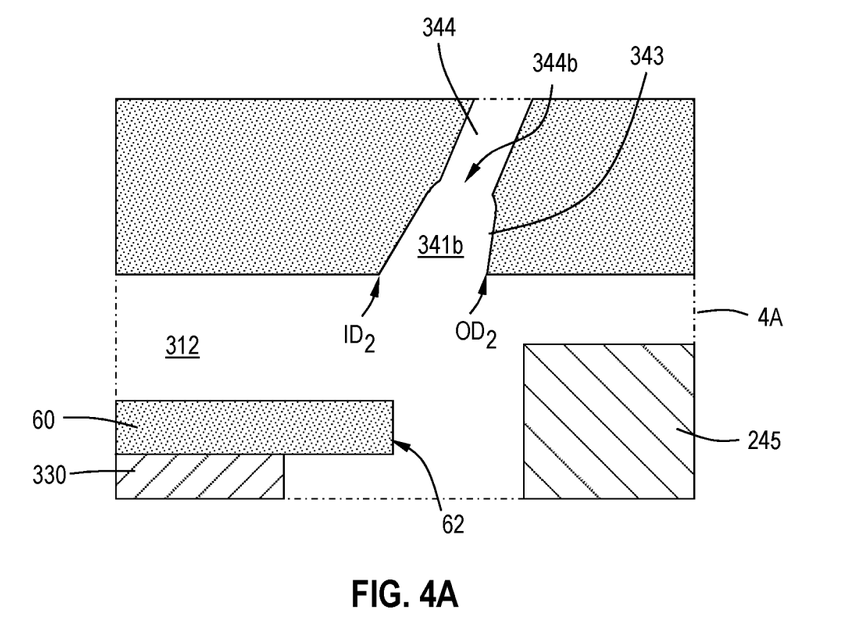
FIG. 4A shows an expanded view of region 4A of FIG. 4.
Figure 4B:
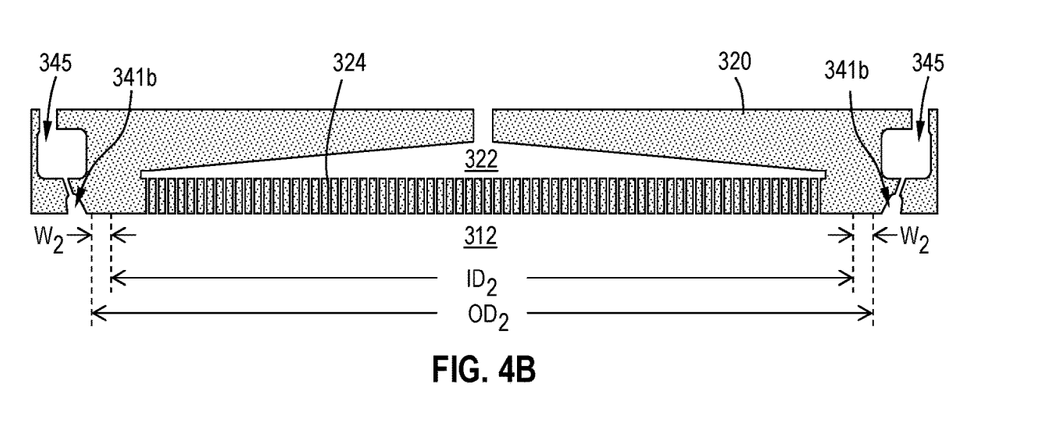
FIG. 4B shows a cross-sectional schematic view of a gas distribution plate in accordance with one or more embodiment of the disclosure.

Referring to FIGS. 3, 3A, 3B, 4, 4A and 4B, one or more embodiments of the disclosure are directed to processing chambers comprising a plurality of processing regions. FIG. 3 shows a portion of a first processing region 311. For example, the first processing region 311 may be part of the left processing station 110a shown in FIG. 2. FIG. 3A shows an expanded view of region 3A of FIG. 3. FIG. 3B shows a view of the gas distribution plate 320 of FIG. 3A. FIG. 4 shows a portion of a second processing region 312; and FIG. 4A shows an expanded view of region 4A of FIG. 4. FIG. 4B shows a view of the gas distribution plate 320 of FIG. 4A. For example, the second processing region 312 may be part of the right processing station 110b shown in FIG. 2. The use of ordinals such as "first", "second", etc., are for descriptive purposes only to refer to different components and should not be taken as any particular order of operation or priority.

Each processing region 311, 312 independently has a height H defined by a front face 321 of a gas distribution plate 320 and a top surface 331 of a substrate support 333. The height H of the processing region 311, 312 is decreased when a wafer 60 is positioned on the top surface 331 of the substrate support 333, as shown. Each of the processing regions 311, 312 is bounded around an outer peripheral edge by one or more vacuum channel 341a, 341b.

The gas distribution plate 320 illustrated in FIGS. 3, 3B, 4 and 4B include a plenum 322 region into which a reactive gas flows. The reactive gases flow from the plenum 322 to the processing regions 311, 312 through apertures 324. The Figures show three apertures 324 for illustrative purposes only and should not be taken as limiting the scope of the disclosure. The skilled artisan will be familiar with the arrangement and configuration of apertures 324 is a showerhead gas distribution plate. In some embodiments, the gas distribution plate 320 does not have a plenum 322 region and the gases flow directly into the processing regions without passing through apertures.

The first processing region 311 has a first vacuum channel 341a with a first inner diameter $ID_1$, a first outer diameter $OD_1$ and a first vacuum channel width $W_1$. The first vacuum channel 341a is described as being a part of the first processing region 311; however, the skilled artisan will understand that the first vacuum channel 341a is part of the gas distribution plate 320 or other component bounding the first processing region 311. Stated differently, the gas distribution plate 320 bounding the first processing region 311 has a first vacuum channel 341a with a first inner diameter $ID_1$, a first outer diameter $OD_1$, a first vacuum channel width $W_1$, as shown in FIG. 3B.

The second processing region 312 has a second vacuum channel 341b with a second inner diameter $ID_2$, a second outer diameter $OD_2$ and a second vacuum channel width $W_2$. The second vacuum channel 341b is described as being a part of the second processing region 312; however, the skilled artisan will understand that the second vacuum channel 341b is part of the gas distribution plate 320 or other component bounding the second processing region 312. Stated differently, the gas distribution plate 320 bounding the second processing region 312 has a second vacuum channel 341b with a second inner diameter $OD_1$, second outer diameter $OD_2$ and second vacuum channel width $W_2$, as shown in FIG. 3B.

Figure 7:
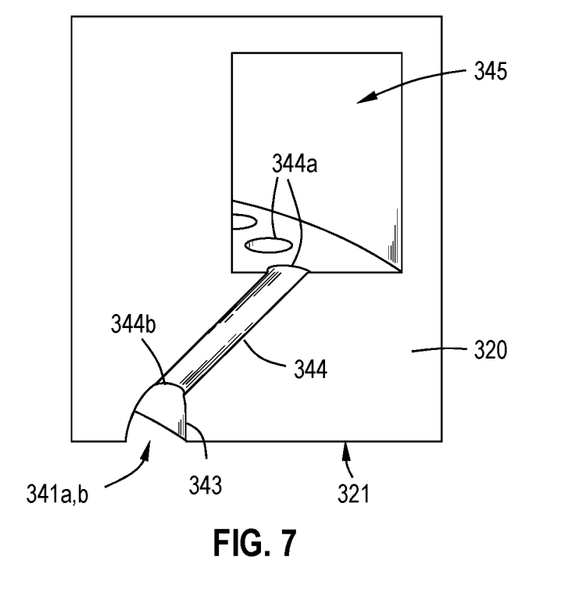
FIG. 7 shows a schematic cross-sectional view of a portion of a gas distribution plate in accordance with one or more embodiment of the disclosure.

FIG. 7 shows a cross-sectional view of the vacuum channels according to one or more embodiment of the disclosure. The first vacuum channel 341a and/or second vacuum channel 341b of some embodiments is a trench 343 formed in the bottom surface of the showerhead. The trench 343 is connected to a vacuum plenum 345 through a plurality of conduits 344. Each of the conduits having an opening 344a in the plenum 345 and an opening 344b at the trench 343 to provide fluid communication between the trench 343 and the plenum 345.

In some embodiments, the first outer diameter $OD_1$ is less than the second outer diameter $OD_2$. Stated differently, in some embodiments, the second outer diameter $OD_2$ is greater than the first outer diameter $OD_1$. In some embodiments, the first outer diameter $OD_1$ is greater than the second outer diameter $OD_2$. Stated differently, in some embodiments, the second outer diameter $OD_2$ is less than the first outer diameter $OD_1$.

In a binary reaction—a reaction using a precursor dose and a reactant dose—of some embodiments there are two different process processing regions; a first processing region 311 and a second processing region 312. Each of the first processing region 311 and the second processing region 312 has a vacuum channel 341a, 341b. The outer diameters $OD_1$, $OD_2$ of the vacuum channels 341a, 341b differ depending on, for example, the reactivity of the reactive species being delivered in the particular processing region. For example, in some embodiments of binary reactions, one of the first reactive gas or the second reactive gas has a slower reaction rate. The reactant with the slower reaction rate is referred to as the rate limiting reactant because the deposition process cannot proceed at a faster rate than the rate limiting reactant can react with the substrate surface. In some embodiments, the vacuum channel with the greater outer diameter is associated with the reactant that is the rate limiting reactant.

In some embodiments, the outer diameters of the vacuum channels are different to change the size of a transition zone between the full deposition on the wafer and no deposition on the edge exclusion zone of the wafer. The deposition transition zone is formed from an atomic layer deposition (ALD) reaction between the first reactant and the second reactant. In some embodiments, the first processing region 311 and the second processing region 312 are concentric.

The outer portion of the wafer is a region that is a contact point during processing and is generally omitted in final devices. This region of the wafer is referred to as the Edge Exclusion Zone. Typically, the Edge Exclusion Zone has a width of about 2 mm. For example, a 300 mm diameter wafer with a 2 mm Edge Exclusion Zone provides a usable area with a 296 mm diameter (300 mm less 2 mm from either side).

Figure 5:
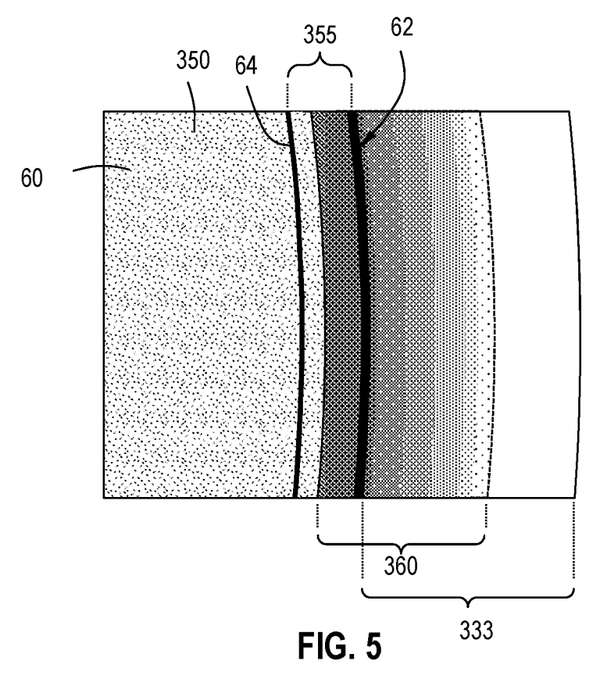
FIGS. 5 and 6 show schematic views of deposition transition regions in accordance with one or more embodiment of the disclosure.

FIG. 5 shows a schematic representation of an outer peripheral edge 62 of a wafer 60 with a portion of the substrate support 333. The wafer 60 illustrated has a thick line 64 showing the beginning of the edge exclusion zone 355 and a thicker line showing the outer peripheral edge 62 of the wafer 60. In some embodiments, the substrate support 333 has a region where full deposition continues outside the diameter of the wafer. A transition zone 360 is outside the region 350 of full deposition. The transition zone 360 has a gradient of deposition thickness decreasing the full deposition at the region 350 to no deposition at region 365 outside of the transition zone 355.

In a typical ALD process, the transition zone between full deposition and no deposition has a width of about 6 mm. In the embodiment illustrated, the transition zone 360 begins within the edge exclusion zone 355 and extends beyond the outer peripheral edge 62 of the wafer 60, resulting in deposition on the portion of the substrate support 333. If the transition zone starts at the beginning of the Edge Exclusion Zone, then there will be at least 4 mm of deposition on the substrate support.

Accordingly, some embodiments of the disclosure advantageously provide apparatus and methods to decrease the width of the transition zone to decrease the width of deposition on the substrate support. In some embodiments, the width of the transition zone is decrease and positioned so that the entire transition zone falls within the Edge Exclusion Zone of the wafer.

Figure 6:
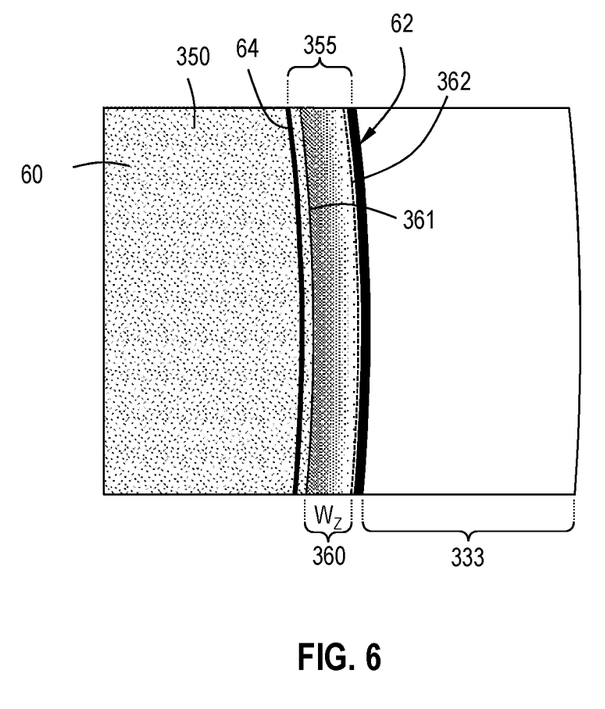

FIG. 6 shows another embodiment with a similar view to that of FIG. 5, using an apparatus according to one or more embodiment of the disclosure. In the embodiment illustrated in FIG. 6, the transition zone 360 which extends from the region 350 of full deposition at line 361 to no deposition at the dotted line 362 has a width less than the width of the edge exclusion zone 355. In the illustrated embodiment, the entire transition zone 360 is within the edge exclusion zone 355 so that the region 350 of full deposition covers the wafer 60 into the edge exclusion zone 355 and no deposition occurs on the substrate surface 333.

In some embodiments, the deposition transition zone 360 is smaller than the deposition transition zone formed on a substrate in a similar processing chamber where the first outer diameter and the second outer diameter are the same. In some embodiments, the deposition transition zone 360 is smaller than a deposition transition zone formed in a processing chamber with one vacuum channel. For example, a single wafer processing chamber in which a time-domain ALD process is performed.

The inventors have found that differences in the first outer diameter $OD_1$ and second outer diameter $OD_2$ can affect the width $W_z$ of the transition zone 355. In some embodiments, the difference between the first outer diameter $OD_1$ and the second outer diameter $OD_2$ is greater than or equal to 1 mm, 2 mm, 3 mm, 4 mm, 5 mm, 6 mm, 7 mm, 8 mm, 9 mm or 10 mm. In some embodiments, the difference between the first outer diameter $OD_1$ and the second outer diameter $OD_2$ is in the range of 1 mm to 8 mm, or in the range of 2 mm to 5 mm.

In some embodiments, the differences between the first outer diameter $OD_1$ and the second inner diameter $ID_2$ affect the width $W_z$ of the transition zone 355. In some embodiments, the difference between the first outer diameter $OD_1$ and the second inner diameter $ID_2$ is greater than or equal to 1 mm, 2 mm, 3 mm, 4 mm, 5 mm, 6 mm, 7 mm, 8 mm, 9 mm or 10 mm. In some embodiments, the difference between the first outer diameter $OD_1$ and the second outer diameter $OD_2$ is in the range of 1 mm to 8 mm, or in the range of 2 mm to 5 mm. In some embodiments, the difference between the first outer diameter $O_1$ and the second inner diameter $ID_2$ is a negative number less than or equal to 5 mm, 4 mm, 3 mm, 2 mm or 1 mm. As used in this manner, a negative width means that the second inner diameter $ID_2$ is smaller than the first outer diameter $OD_1$. In some embodiments, the second inner diameter $ID_2$ is within ±0.5 mm or ±0.25 mm of the first outer diameter $OD_1$.

In some embodiments, the first inner diameter $ID_1$ is within ±5 mm, ±10 mm, ±15 mm, or ±20 mm of the outer diameter of a wafer to be processed. For example, in some embodiments in which a 300 mm wafer are to be processed, the first inner diameter $ID_1$ is in the range of 280 mm to 320 mm, or in the range of 285 mm to 315 mm, or in the range of 290 mm to 310 mm, or in the range of 295 mm to 305 mm.

In some embodiments, the first outer diameter $OD_1$ is less than the diameter of a wafer supported on the substrate support. In some embodiments, the first outer diameter $OD_1$ is less than or equal to 5, 4, 3, 2 or 1 mm less than the diameter of a wafer to be processed. Stated differently, in some embodiments, the first outer diameter $OD_1$ is smaller than a diameter of substrate to be processed by an amount less than or equal to 5, 4, 3, 2 or 1 mm.

In some embodiments, the first outer diameter $OD_1$ is within ±5 mm, ±10 mm, ±15 mm, or ±19 mm of the outer diameter of a wafer to be processed. The first outer diameter $OD_1$ is greater than the first inner diameter $ID_1$. For example, in some embodiments in which a 300 mm wafer are to be processed, the first outer diameter $OD_1$ is in the range of 281 mm to 319 mm, or in the range of 285 mm to 315 mm, or in the range of 290 mm to 310 mm, or in the range of 295 mm to 305 mm.

In some embodiments, the second inner diameter $ID_2$ is within −5 mm, 0 mm, 5 mm, 10 mm, 15 mm, 20 mm, 25 mm, 30 mm, 35 mm or 40 mm of the outer diameter of a wafer to be processed. As used in this manner, a negative number means that the stated diameter is less than the wafer to be processed. For example, in some embodiments in which a 300 mm wafer are to be processed, the second inner diameter $ID_2$ is in the range of 295 mm to 340 mm, or in the range of 300 mm to 335 mm, or in the range of 305 mm to 330 mm, or in the range of 310 mm to 325 mm, or in the range of 315 mm to 320 mm.

In some embodiments, the second outer diameter $OD_2$ is within −4 mm, 0 mm, 5 mm, 10 mm, 15 mm, 20 mm, 25 mm, 30 mm, 35 mm, 40 mm or 41 mm of the outer diameter of a wafer to be processed. The second outer diameter $OD_2$ is greater than the second inner diameter $ID_2$. For example, in some embodiments in which a 300 mm wafer are to be processed, the second outer diameter $ID_2$ is in the range of 296 mm to 341 mm, or in the range of 300 mm to 340 mm, or in the range of 305 mm to 335 mm, or in the range of 310 mm to 330 mm, or in the range of 315 mm to 325 mm.

The first vacuum channel width $W_1$ of some embodiments is less than or equal to 10 mm, 9 mm, 8 mm, 7 mm, 6 mm, 5 mm, 4 mm, 3 mm or 2 mm. In some embodiments, the second vacuum channel width $W_2$ is less than or equal to 10 mm, 9 mm, 8 mm, 7 mm, 6 mm, 5 mm, 4 mm, 3 mm or 2 mm. In some embodiments, the opening of the first vacuum channel (the first vacuum channel width $W_1$) and the second vacuum channel (the second vacuum channel width $W_2$) are independently less than or equal to 10 mm, 9 mm, 8 mm, 7 mm, 6 mm, 5 mm, 4 mm, 3 mm or 2 mm.

Referring again to FIGS. 3 and 4, some embodiments further comprise a first purge region 380a and/or a second purge region 380b outside of the first process region 311 and/or second processing region 312, respectively. In some embodiments, the first purge region 380 and/or second purge region 380b include a purge gas port 382a, 382b that provides a flow of purge gas to prevent diffusion of process gases from the processing region 311, 312. In some embodiments, the purge region is outside of the processing regions 311, 312 between the process stations 110 (as shown in FIG. 1). In some embodiments, the first processing region 311 and the second processing region 312 are spatially separated by a purge region.

Some embodiments of the disclosure are directed to methods of processing a substrate. A substrate is exposed to a first reactant in a first processing region 311 and a second reactant in a second processing region 312. The first processing region 311 is bounded around the outer periphery by a first vacuum channel 341a having a first inner diameter $ID_1$ and a first outer diameter $OD_1$ defining a first width $W_1$. The second processing region 312 is bounded around the outer periphery by a second vacuum channel 341b having a second inner diameter $ID_2$ and second outer diameter $OD_2$ defining a second width $W_2$. One of the first outer diameter $OD_1$ of the first vacuum channel 341a or second outer diameter $OD_2$ of the second vacuum channel 341b is greater than the other of the first vacuum channel 341a or second vacuum channel 341b.

In some embodiments, the method further comprises moving the substrate from the first processing region 311 to the second processing region 312. In some embodiments, the substrate support 200 (e.g., that of FIG. 1) can be rotated so that the substrate support moves at a distance around the rotational axis 211 to move the wafer from a first processing station having the first processing region 311 to a second processing station having the second processing region 312.

Figure 8:
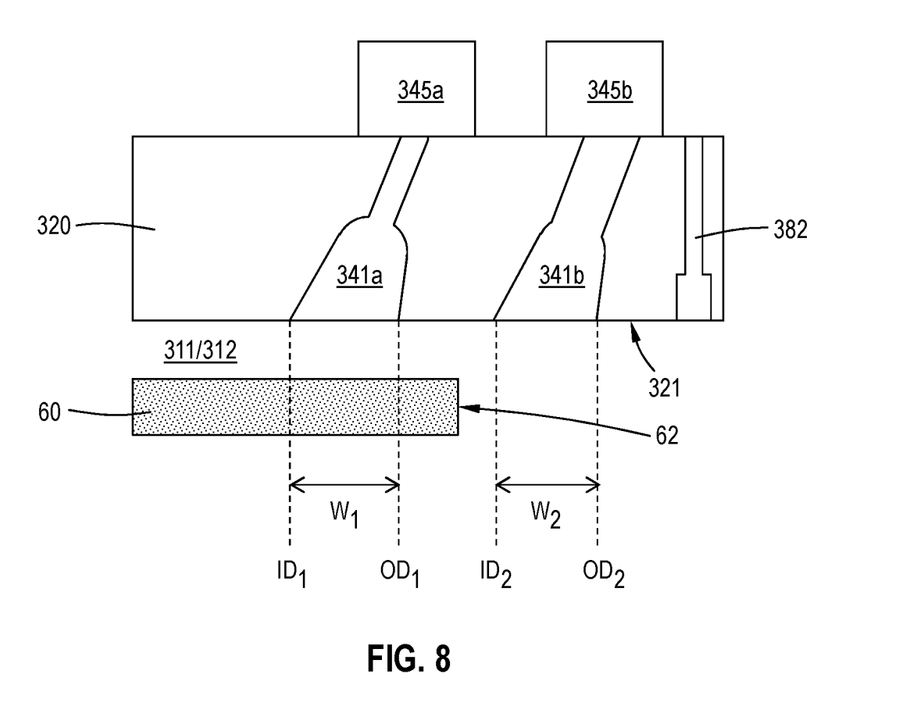
FIG. 8 shows a partial schematic cross-sectional view of a gas distribution plate in accordance with one or more embodiment of the disclosure.

Some embodiments of the disclosure are directed to showerheads or gas distribution plates 320 with dual exhaust channels. FIG. 8 shows an embodiment of a gas distribution plate 320 in which the first processing region 311 and second process region 312 overlap. The processing regions are bounded by a first vacuum channel 341a and a second vacuum channel 341b. One of the first vacuum channel 341a or second vacuum channel 341b are in use with either of the first processing region 311 or second processing region 312. For example, in a first reaction, a first process gas flows into the first processing region 311, flows across the wafer 60 and out the first vacuum channel 341a. In a second reaction, a second process gas flows into the second processing region 312, across the wafer 60 and out the second vacuum channel 341b. When the first process gas is flowing, the second vacuum channel 341b can be either under vacuum, at the same pressure as the first processing region 311 or have a purge gas flow to prevent reactive gases from flowing into the second vacuum channel 341b. When the second process gas is flowing, the first vacuum channel 341a can be either under vacuum, at the same pressure as the second processing region 312 or have a purge gas flow to prevent reactive gases from flowing into the first vacuum channel 341a.

In some embodiments, the gas distribution plate 320 includes a dual plenum exhaust. As shown in FIG. 8, in some embodiments, the first vacuum channel 341a is connected to a first plenum 345a and the second vacuum channel 341b is connected to a second plenum 345b. The first plenum 345a and second plenum 345b at any given time during processing can be under vacuum conditions or have a gas flowing toward the processing region. In some embodiments, a purge gas channel 382 is on the opposite side of the vacuum channels from the processing regions to provide a purge gas flow to prevent reactive gases from migrating into the rest of the processing chamber.

Figure 9:
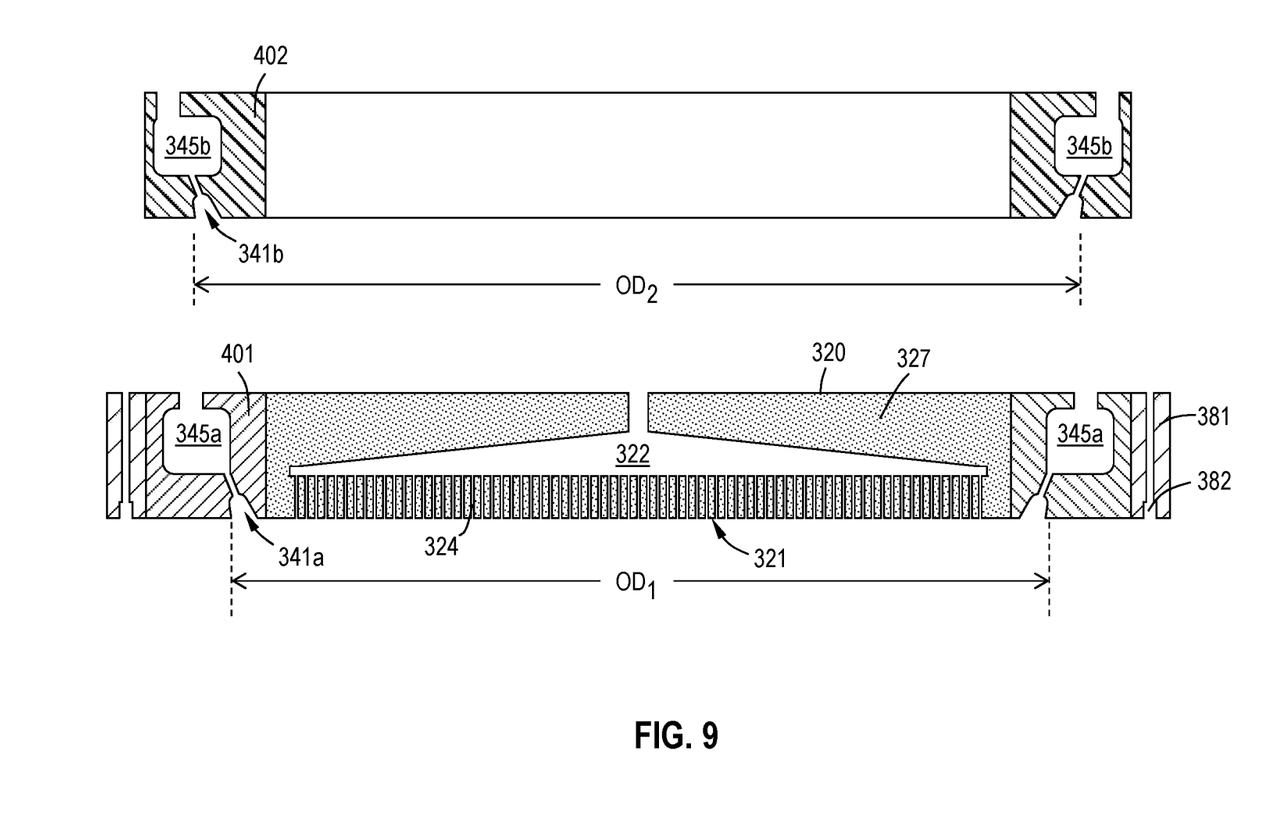
FIG. 9 shows a cross-sectional schematic view of a gas distribution plate with replaceable purge ring in accordance with one or more embodiment of the disclosure.

In some embodiments, the gas distribution plate 320 comprises separable showerhead 327 and pump rings 401, 402. A purge ring 381 in some embodiments surrounds the pump rings 401, 402 when the gas distribution plate 320 is assembled. The separable gas distribution plate 320 allows for easy changing of the outer diameter for the vacuum channel. For example, the first pump ring 401 having a first vacuum channel 341a with a first outer diameter $OD_1$ can be replaced with the second pump ring 402 which has a second vacuum channel 341b with a second outer diameter $OD_2$.

In some embodiments, there are multiple processing stations like that shown in FIG. 1. In some embodiments, the substrate support is configured to support multiple substrates on more than one heater, electrostatic chuck, or more generally, a support surface. The pump ring of the gas distribution plates 320 can be easily changed to tune the deposition transition zone by changing pump rings with different outer diameters.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A processing chamber comprising:
a plurality of processing regions, each processing region independently having a height defined by a front face of a gas distribution plate and a top surface of a substrate support, each of the processing regions bounded around an outer peripheral edge by one or more vacuum channels,
wherein a first processing region has a first vacuum channel formed in a bottom surface of the gas distribution plate, the first vacuum channel having a first outer diameter associated with a first reactant to form a first film, the first vacuum channel comprising a first trench, the first trench being connected to a first vacuum plenum through a first plurality of conduits and
a second processing region has a second vacuum channel formed in a bottom surface of the gas distribution plate, the second vacuum channel having a second outer diameter associated with a second reactant to form a second film, the second vacuum channel comprising a second trench, the second trench being connected to a second vacuum plenum through a second plurality of conduits, and
the first outer diameter being less than the second outer diameter, wherein the first outer diameter and the second outer diameter are configured to provide a reduced width deposition transition zone defined by full deposition on a wafer placed on the substrate support and less deposition on the substrate support, the processing chamber configured to move a substrate between the first processing region and the second processing region to form a film by an atomic layer deposition process, wherein the second reactant has a slower reaction rate than the first reactant.

2. The processing chamber of claim 1, wherein a difference between the first outer diameter and the second outer diameter is in the range of 2 mm to 5 mm.

3. The processing chamber of claim 1, wherein the first outer diameter is less than a diameter of the substrate support.

4. The processing chamber of claim 3, wherein the first outer diameter is less than or equal to 2 mm less than the diameter of the wafer.

5. The processing chamber of claim 4, wherein the first processing region and the second processing region are concentric.

6. The processing chamber of claim 5, further comprising a purge region outside of the second processing region.

7. The processing chamber of claim 1, wherein the first processing region and the second processing region are spatially separated by a purge region.

8. The processing chamber of claim 1, wherein an opening of the first vacuum channel and an opening of the second vacuum channel are independently less than or equal to 8 mm.

9. A processing chamber comprising:
a substrate support with a top surface configured to support a wafer during processing and move the wafer between a plurality of processing regions;
a first processing region comprising a first gas distribution plate having a first front face opposite the top surface of the substrate support, the first gas distribution plate bounded by a first vacuum channel on the first front face having a first outer diameter, the first vacuum channel formed in a bottom surface of the first gas distribution plate, the first vacuum channel comprising a first trench, the first trench being connected to a first vacuum plenum through a first plurality of conduits; and
a second processing region comprising a second gas distribution plate having a second front face opposite the top surface of the substrate support, the second gas distribution plate bounded by a second vacuum channel on the second front face, the second vacuum channel formed in a bottom surface of the second gas distribution plate, the second vacuum channel comprising a second trench, the second trench being connected to a second vacuum plenum through a second plurality of conduits, and the second vacuum channel having a second outer diameter which is greater than the first outer diameter,
the processing chamber configured to move the substrate support between the first processing region where a first reaction with the substrate surface occurs with a flow of a first process gas, and the second processing region where a second reaction with the substrate surface occurs with a flow of a second process gas, wherein the second process gas has a slower reaction rate than the first process gas.

10. The processing chamber of claim 9, wherein the substrate support is configured to support multiple wafers.

11. The processing chamber of claim 9, wherein the first outer diameter and the second outer diameter have a difference in a range of 2 mm to 5 mm.

12. The processing chamber of claim 9, wherein the first outer diameter is less than the diameter of the substrate support.

13. The processing chamber of claim 12, wherein the first outer diameter is less than the diameter of the wafer by an amount less than or equal to 2 mm.

14. The processing chamber of claim 9, wherein the opening of the first vacuum channel and the second vacuum channel is less than or equal to 8 mm.

* * * * *

UNITED STATES PATENT AND TRADEMARK OFFICE
CERTIFICATE OF CORRECTION

PATENT NO. : 12,060,638 B2
APPLICATION NO. : 17/120186
DATED : August 13, 2024
INVENTOR(S) : Joseph AuBuchon et al.

It is certified that error appears in the above-identified patent and that said Letters Patent is hereby corrected as shown below:

In the Specification

Column 7, Line 67, replace "O1" after "first outer diameter" and before "and the second" with "$OD_1$".

Signed and Sealed this
Fifteenth Day of October, 2024

Katherine Kelly Vidal
*Director of the United States Patent and Trademark Office*